(12) United States Patent
Lowes et al.

(10) Patent No.: US 9,035,328 B2
(45) Date of Patent: May 19, 2015

(54) LIGHT-EMITTING DIODE COMPONENT

(75) Inventors: Theodore D. Lowes, Lompoc, CA (US); Eric J. Tarsa, Goleta, CA (US); Bernd P. Keller, Santa Barbara, CA (US); David T. Emerson, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 646 days.

(21) Appl. No.: 13/021,496

(22) Filed: Feb. 4, 2011

(65) Prior Publication Data
US 2012/0199852 A1 Aug. 9, 2012

(51) Int. Cl.
*H01L 33/00* (2010.01)
*H01L 29/18* (2006.01)
*G09F 9/33* (2006.01)
*H01L 25/075* (2006.01)
*G09F 9/302* (2006.01)
*H01L 33/54* (2010.01)

(52) U.S. Cl.
CPC .............. *G09F 9/33* (2013.01); *H01L 25/0753* (2013.01); *H01L 33/54* (2013.01); *G09F 9/3026* (2013.01); *H01L 2924/0002* (2013.01)

(58) Field of Classification Search
CPC ...................................................... H01L 33/54
USPC .................................................... 257/88, 99
See application file for complete search history.

(56) References Cited

U.S. PATENT DOCUMENTS

| | | | |
|---|---|---|---|
| 5,309,277 A * | 5/1994 | Deck | 359/387 |
| 6,948,838 B2 * | 9/2005 | Kunstler | 362/545 |
| 7,334,918 B2 * | 2/2008 | Newton et al. | 362/239 |
| 7,649,209 B2 | 1/2010 | Hussell et al. | 257/98 |
| 7,709,853 B2 | 5/2010 | Medendorp, Jr. | 257/99 |
| 7,821,023 B2 | 10/2010 | Yuan et al. | 257/98 |
| 7,829,899 B2 | 11/2010 | Hutchins | 257/79 |
| 8,328,392 B2 * | 12/2012 | Hung et al. | 362/249.02 |
| 2004/0004844 A1 | 1/2004 | Ryan, Jr. | |
| 2004/0037076 A1 * | 2/2004 | Katoh et al. | 362/235 |
| 2006/0102914 A1 * | 5/2006 | Smits et al. | 257/98 |
| 2009/0050907 A1 * | 2/2009 | Yuan et al. | 257/88 |
| 2009/0050908 A1 | 2/2009 | Yuan et al. | 257/88 |

(Continued)

FOREIGN PATENT DOCUMENTS

JP 6177424 A 6/1994
WO WO 2006/111805 A1 10/2006

OTHER PUBLICATIONS

International Preliminary Report on Patentability for PCT Patent Application No. PCT/US2012/022305 dated Aug. 6, 2013 (pp. 8).

*Primary Examiner* — Matthew Landau
*Assistant Examiner* — Igwe U Anya
(74) *Attorney, Agent, or Firm* — Brinks Gilson & Lione

(57) ABSTRACT

An LED component includes, according to a first embodiment, a monolithic substrate, an array of LED chips disposed on a surface of the substrate, and an optical lens overlying the LED chips and having a lens base attached to the substrate, where the LED chips are positioned to provide a peak emission shifted from a perpendicular centerline of the lens base. The LED component includes, according to a second embodiment, a monolithic substrate, an array of LED chips disposed on a surface of the substrate, and an array of optical lenses, each optical lens overlying at least one of the LED chips and having a lens base attached to the substrate, where at least one of the LED chips is positioned to provide a peak emission shifted from a perpendicular centerline of the respective lens base.

19 Claims, 11 Drawing Sheets

(56) References Cited

U.S. PATENT DOCUMENTS

| | | | |
|---|---|---|---|
| 2009/0108281 A1 | 4/2009 | Keller et al. | 257/98 |
| 2010/0001296 A1* | 1/2010 | Hamanaka et al. | 257/88 |
| 2010/0157595 A1* | 6/2010 | Lin et al. | 362/235 |
| 2010/0328941 A1* | 12/2010 | Zhang et al. | 362/235 |
| 2011/0001149 A1 | 1/2011 | Chan et al. | 257/91 |
| 2011/0291131 A1* | 12/2011 | Ito | 257/93 |

\* cited by examiner

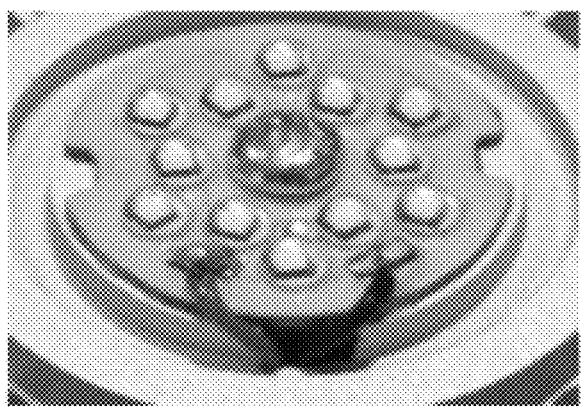
FIG. 13A
FIG. 13B
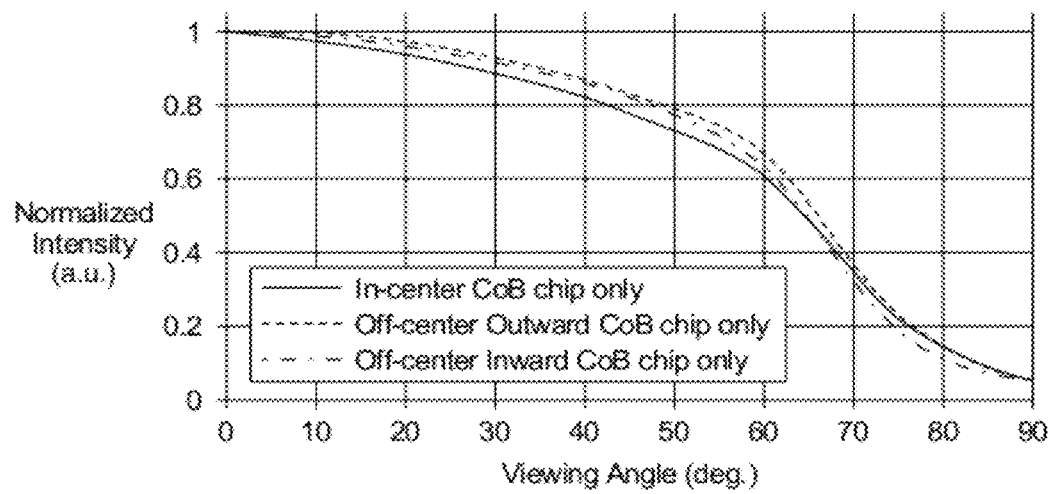
FIG. 13C  FIG. 13D  FIG. 13E
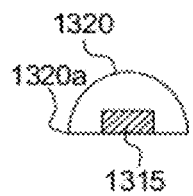
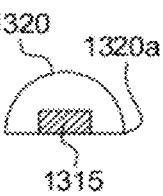
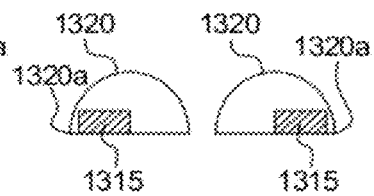

LIGHT-EMITTING DIODE COMPONENT

TECHNICAL FIELD

The present disclosure is directed generally to light emitting diodes (LEDs) and more particularly to LED components that can produce a desired light emission profile.

BACKGROUND

Light emitting diodes (LEDs) are solid state devices that convert electric energy to light, and generally comprise one or more active layers of semiconductor material sandwiched between oppositely doped layers. When a bias is applied across the doped layers, holes and electrons are injected into the active layer where they recombine to generate light. Light is emitted from the active layer and from all surfaces of the LED.

Technological advances over the last decade or more have resulted in LEDs having a smaller footprint, increased emitting efficiency, and reduced cost. LEDs also have an increased operation lifetime compared to other emitters. For example, the operational lifetime of an LED can be over 50,000 hours, while the operational lifetime of an incandescent bulb is approximately 2,000 hours. LEDs can also be more robust than other lights sources and can consume less power. For these and other reasons, LEDs are becoming more popular and are being used in applications that have traditionally been the realm of incandescent, fluorescent, halogen and other emitters.

LEDs are also being used in displays, both big and small. Large screen LED based displays (often referred to as giant screens) are becoming more common in many indoor and outdoor locations, such as at sporting events, race tracks, concerts and in large public areas, such as Times Square in New York City. Many of these displays or screens can be as large as 60 feet tall and 60 feet wide. These screens can include thousands of "pixels" or "pixel modules," each of which may contain a plurality of LEDs. The pixel modules can use high efficiency and high brightness LEDs that allow the displays to be visible from relatively far away, even in the daytime when viewed in sunlight. The pixel modules can have as few as three LEDs (one red, one green, and one blue) that allow the pixel to emit many different colors of light from combinations of red, green and/or blue light. In the largest jumbo screens, each pixel module can have dozens of LEDs. The pixel modules are arranged in a rectangular grid. For example, a grid can be 640 modules wide and 480 modules high, with the end size of the screen being dependent upon the actual size of the pixel modules.

Conventional LED based displays are controlled by a computer system that accepts an incoming signal (e.g., a television signal) and, based on the particular color needed at the pixel module to form the overall display image, the computer system determines which LED in each of the pixel modules is to emit light and how brightly. A power system can also be included that provides power to each of the pixel modules; the power to each of the LEDs may be modulated so that each LED emits at the desired brightness. Conductors are provided to apply the appropriate power signal to each of the LEDs in the pixel modules.

Present technology utilizes optics and geometries that maximize light extraction from the LED to obtain uniform emission profiles. This usually entails a hemispherical lens coupled to a light emitting element where the optical centers of the lens and the emitting surface are perfectly aligned, and the peak light emission is along the optical axis. Such a configuration may not be advantageous for all situations, however, such as when the LED display is mounted above the viewer's eye level.

Referring now to FIGS. 1 and 2, an exemplary LED display 10 is shown mounted at an elevated point above the eye level of the viewer 12. The viewer 12 is typically positioned below the display 10 and looks up to the display such that the viewer's line of sight 14 to the display 10 is at an angle θ with respect to the display's emission direction 16, which is perpendicular to the display surface. Referring now to FIG. 2, the LED display as shown in FIG. 1 includes a plurality of emitters, such as the LED package 20, which may include an LED 22 mounted in a reflective cup 24 and encased in a generally bullet-shaped encapsulant 26. The peak emission for the LED package 20 is along the package's longitudinal axis 28. FIG. 3 is a polar iso-candelar graph 30 for the LED package 20, showing the peak emission along the emitter's longitudinal axis.

FIG. 1 shows a display comprising a plurality of LED packages 20 emitting with characteristics that display a peak emission directed along the perpendicular direction 16. The intensity profile (Iv) and far field pattern (FFP) peak emission characteristics for the LED display 10 are also perpendicular to the display along the perpendicular axis 16. Because the viewer's line of sight 14 is below perpendicular when the display 10 is mounted at an elevated point, much of the light emitted by the display may not be seen by the viewer and is thus wasted.

One way to reduce the amount of light that is wasted is by mounting the display at an angle to better match the viewer's line of sight 14, but this can require complex and expensive mounting hardware that is difficult to use, particularly for very large displays mounted at high elevations. Efforts have also been made to control the light emission from LED packages by modifying the shape of the encapsulant or lens, but this may require special, costly lens tooling and modified lens fabrication processes. Some systems may utilize secondary optics to alter beam profiles or redirect light patterns to different angles; however, the secondary optics may incur significant losses on the order of 10-12% and add cost to the display system.

BRIEF SUMMARY

Described herein is a light emitting diode (LED) component that can produce a desired light emission profile.

The LED component includes, according to a first embodiment, a monolithic substrate, an array of LED chips disposed on a surface of the substrate, and an optical lens overlying the LED chips and having a lens base attached to the substrate, where the LED chips are positioned to provide a peak emission shifted from a perpendicular centerline of the lens base.

The LED component includes, according to a second embodiment, a monolithic substrate, an array of LED chips disposed on a surface of the substrate, and an array of optical lenses, each optical lens overlying at least one of the LED chips and having a lens base attached to the substrate, where at least one of the LED chips is positioned to provide a peak emission shifted from a perpendicular centerline of the respective lens base.

The LED component includes, according to a third embodiment, a monolithic substrate, an array of LED chips disposed on a surface of the substrate, and an array of optical lenses, each optical lens overlying at least one of the LED chips and having a lens base attached to the substrate, where at least one of the lenses is shaped to provide a peak emission shifted from a perpendicular centerline of the respective lens base.

The LED component includes, according to a fourth embodiment, a monolithic substrate and an array of LED chips disposed on a surface of the substrate, where at least one of the LED chips is mounted at a non-zero angle γ with respect to the surface of the substrate.

BRIEF DESCRIPTION OF THE DRAWINGS

FIG. 13A is a photograph of an exemplary LED component that includes 12 LEDs, each with its own hemispherical lens;

FIG. 13B includes a chart showing normalized intensity as a function of angle from the perpendicular centerline, where the data are obtained for three embodiments of the LED component of FIG. 13A, as indicated in FIGS. 13C-13E;

FIGS. 13C-13E show an LED chip at the optical center of a hemispherical lens (FIG. 13C); an LED chip offset radially inward (FIG. 13D); and an LED chip offset radially outward (FIG. 13E);

DETAILED DESCRIPTION

Figure 1:
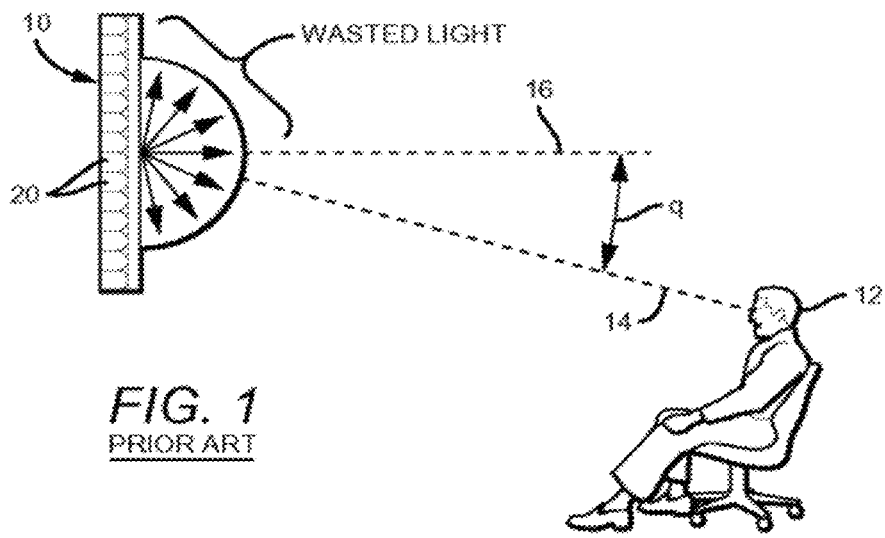
FIG. 1 is a schematic of a conventional LED display mounted above a viewer.
Figure 2:
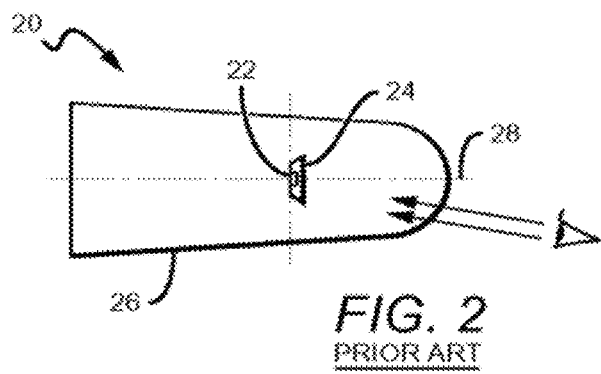
FIG. 2 is a side view of an LED package that could be used in the LED display in FIG. 1.
Figure 3:
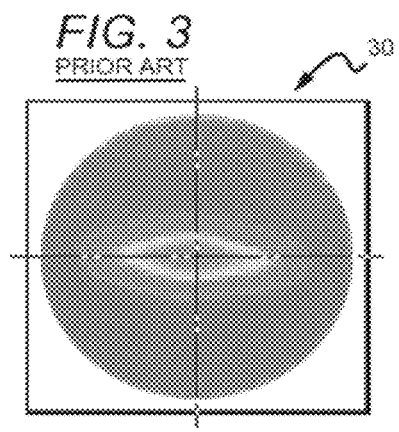
FIG. 3 is polar iso-candelar graph showing the light emission characteristics of the LED package in FIG. 2.

The present disclosure is directed to LED components having a light emission profile that may be controlled independently of the lens shape by varying the position and/or orientation of LED chips with respect to one or both of an overlying lens and the surface of the component. For example, the optical centers of the LED emitting surface and the lens, which are normally aligned, may be offset from each other to generate a controlled and predictable emission profile.

The LED components include an array of LED chips disposed on a surface of a monolithic substrate or submount, where the LED chips are positioned to provide the desired light emission profile. In one embodiment, the array of LED chips may be positioned off-center with respect to an overlying lens in order to shift the peak emission characteristics away from the perpendicular centerline. One or more of the LED chips may also or alternatively be mounted at an angle with respect to the surface of the monolithic substrate to alter the peak emission. Such LED components may be used alone or in combination with other components to form a display that has a desirable set of emission characteristics.

As used in the present disclosure, the "perpendicular centerline" is generally defined with respect to the base of an overlying lens that is attached to the substrate of the LED component. The perpendicular centerline is positioned at the center of the lens base and extends from the surface of the substrate in a direction normal to the plane of the surface (the z-direction in the figures). In some applications in which an LED component is mounted above eye level, it may be advantageous to shift the peak emission of the component down with respect to the perpendicular centerline. It is understood, however, that shifts of the peak emission may be in any direction—up, down, left, right, or in directions in between, as discussed in more detail below.

It is also understood that when an element such as a layer, region or substrate is referred to as being "on" another element, it can be directly on the other element or intervening elements may also be present. Furthermore, relative terms such as "inner," "outer," "upper," "above," "over," "beneath," "below," and similar terms, may be used herein to describe a relationship of one layer or another region. It is understood that these terms are intended to encompass orientations of the device that differ from those depicted in the figures.

Although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

The figures are intended as schematic illustrations. As such, the actual dimensions and shapes of the devices and components (e.g., layer thicknesses) can be different, and departures from the illustrations as a result of, for example, of manufacturing techniques and/or tolerances may be expected. Embodiments should not be construed as limited to the particular shapes of the regions illustrated herein but are to include deviations in shapes that result from, for example, manufacturing. A region illustrated or described as square or rectangular may have rounded or curved features due to normal manufacturing tolerances. Thus, the regions illustrated in the figures are schematic in nature and their shapes are not intended to illustrate the precise shape of a region of a device and are not intended to limit the scope of the invention.

Figure 4A:
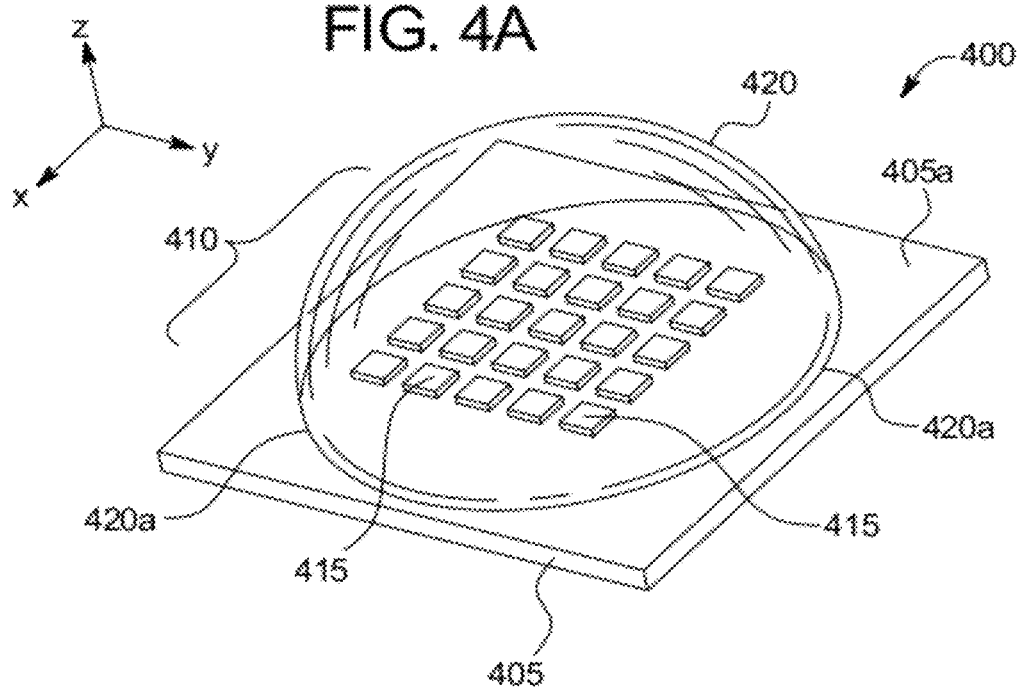
FIG. 4A is a perspective view of an exemplary LED component including an array of LED chips on a monolithic substrate with a single overlying lens.
Figure 4B:
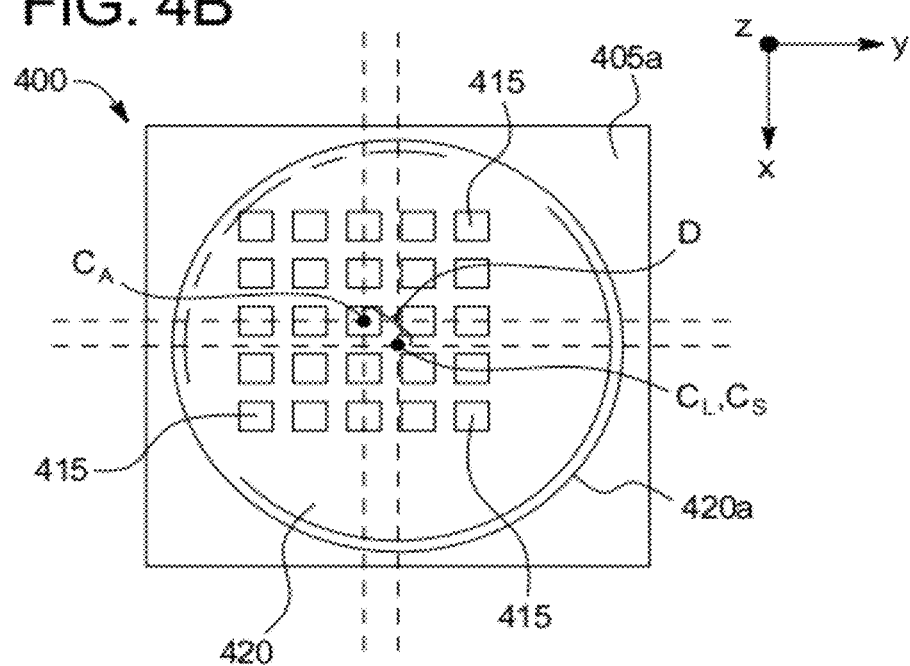
FIG. 4B is a top view of the LED component of FIG. 4A showing the offset between the center $C_A$ of the array of LED chips and the center $C_L$ of the lens base of the overlying lens.

Referring to FIGS. 4A and 4B, the LED component 400 includes a monolithic submount or substrate 405 having a surface 405a on which an array 410 of LED emitters or LED chips 415 is mounted. In this example, the array 410 is an ordered 5×5 array; other array sizes as well as disordered or aperiodic arrays are also possible. A center $C_A$ of the array 410 of LED chips 415 may be defined by the point of intersection of two lines that bisect the array 410 in the x-direction and the y-direction, respectively, as indicated in FIG. 4B.

The LED component 400 further includes an optical lens 420 that is attached to the surface 405a of the substrate 405 and overlies at least one of the LED chips 415 in the array 410. In this example, the lens 420 overlies all of the LED chips 415 in the array 410. (Alternatively, a plurality of lenses may be attached to the submount and may overlie individual LED chips, as discussed further below.) The lens 420 is designed to shape the emitted light beam as well as to provide environmental and/or mechanical protection for the LED chip(s). The lens 420 may have a hemispherical shape, as shown in FIG. 4A, or another symmetric or asymmetric shape, as shown for example in FIG. 16.

The lens 420 has a lens base 420a that is attached (e.g., overmolded) to the submount 405. In this example, the lens 410 is directly attached to the submount 405; however, it is also possible for the lens to be indirectly attached to the submount by way of a connection to another object that is in turn attached to the submount. For example, the lens may be attached to a retaining ring that is in turn attached to the submount. A lens that is said to be "attached" to the submount or substrate may thus be directly or indirectly attached thereto.

A center $C_L$ of the lens base 420a may be defined by the point of intersection of two lines that bisect the lens base 420a in the x-direction and the y-direction, respectively, as indicated in FIG. 4B. The x- and y-directions lie in the plane of the substrate. Throughout the present patent document, where a "center" is designated for a given array or other object, the center is understood to be the point of intersection of two lines that bisect the array or other object in the x- and y-directions. Similarly, a center $C_S$ of the submount 405 may be defined by the point of intersection of two lines that bisect the surface 405a of the submount 405 in the x-direction and the y-direction, respectively. In FIG. 4B, the center $C_L$ of the lens base overlies the center $C_S$ of the submount. In this case, the center $C_S$ of the surface of the submount 405 corresponds to the physical center of the surface 405a of the submount 405. In another implementation, where the submount 405 may include additional (non-light emitting) components such as mounting pads along one side, the center $C_S$ may be defined to coincide with the center of the portion of the submount surface that does not include the additional components.

Traditionally, the lens is positioned on the submount such that the center $C_L$ of the lens base is aligned with the center $C_A$ of the array. However, in order to provide a desired emission profile or peak emission shift, the center $C_A$ of the array 410 of LED chips 415 is displaced from the center $C_L$ of the lens base 420a, as shown in FIG. 4B. The offset or displacement D may be in the ±x-direction, the ±y-direction, or in a direction lying between the ±x-direction and the ±y-direction. The offset may be achieved during fabrication by positioning the array 410 of LED chips 415 on the surface 405a of the submount 405 such that the center $C_A$ of the array 410 is displaced from the center $C_S$ of the submount 405, and then centering the lens 420 on the submount, as shown in FIG. 4, or by centering the array of LED chips on the submount and then mounting the lens such that the center $C_L$ of the lens base is offset with respect to the center $C_A$ of the array (and the surface of the submount). The amount of the displacement D may depend on the size of the LED chips 415, the LED array 410, and/or the lens 420 as well as the desired shift in the peak emission, but typically lies between about 0.1 mm and 6.0 mm. The displacement D may also lie between about 0.1 mm and about 3.0 mm or between about 0.1 mm and about 1.0 mm.

Figure 5A:
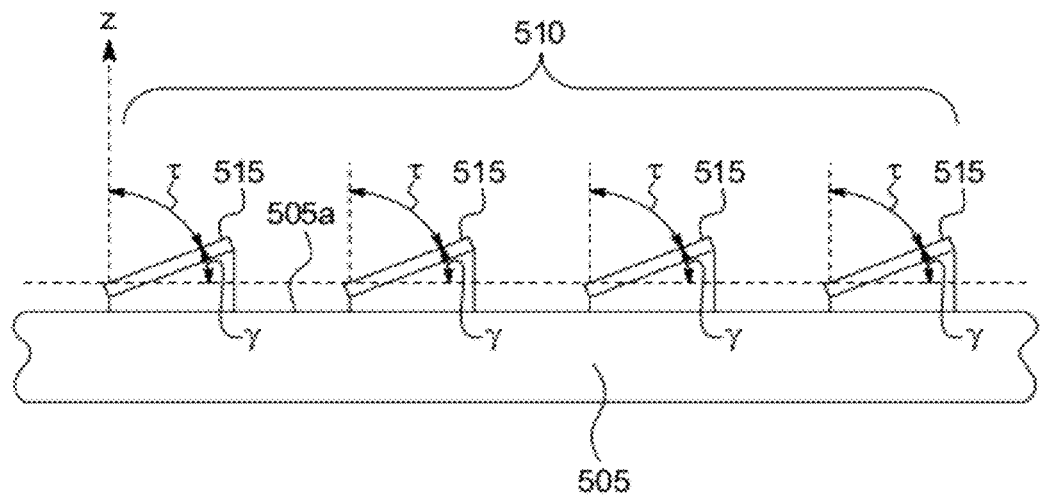
FIG. 5A is a cross-sectional view of a portion of an exemplary array of LED chips on a monolithic substrate where a plurality of the LED chips exhibit a tilt τ with respect to the perpendicular centerline.
Figure 5B:
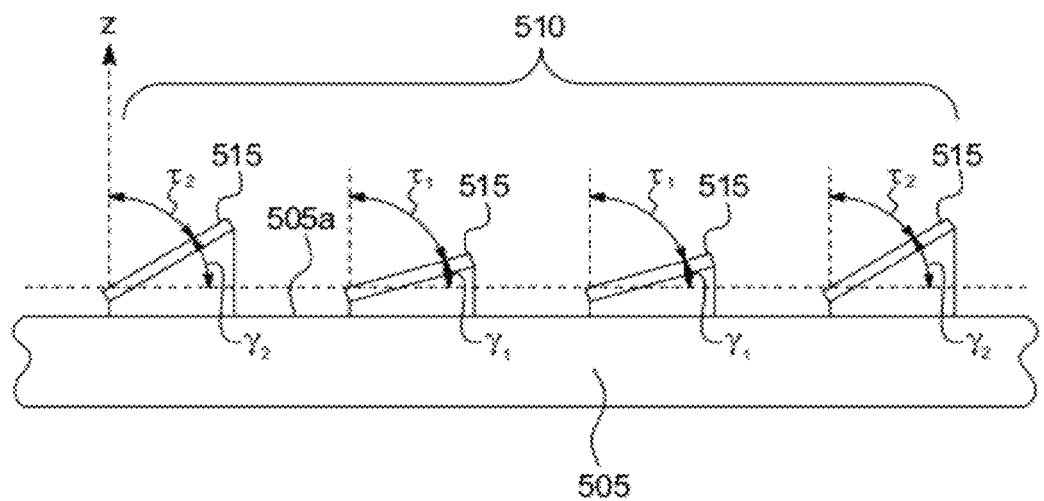
FIG. 5B is a cross-sectional view of a portion of another exemplary array of LED chips on a monolithic substrate where the LED chips exhibit different tilts $\tau_1$ and $\tau_2$.
Figure 10:
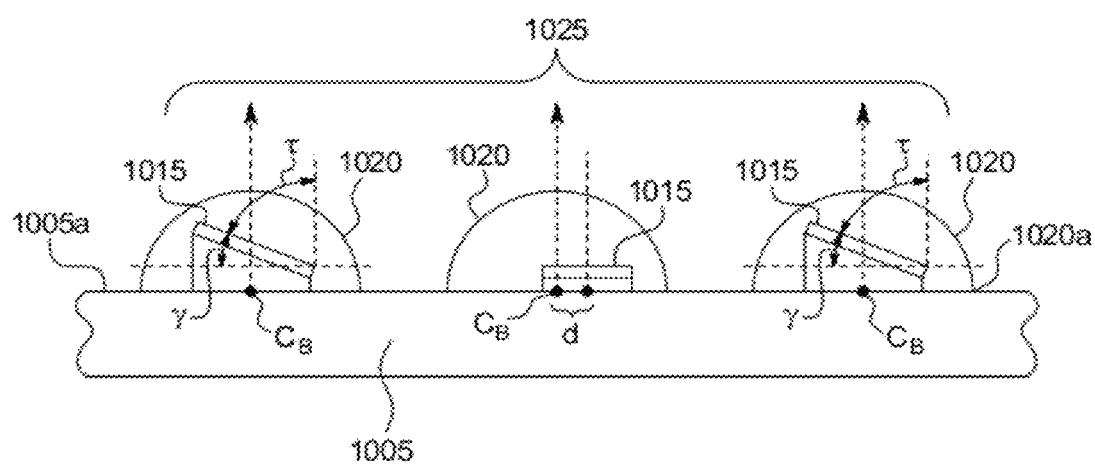
FIG. 10 is a cross-sectional view of a portion of an LED component including an array of LED chips with overlying lenses and a combination of tilts and displacements.

The emission profile may also be shifted off the centerline by tilting one or more of the LED chips on the submount. Referring to FIGS. 5A and 5B, one or more of the LED chips 515 in the array 510 may be mounted at an angle γ with respect to the surface 505a of the submount 505. FIG. 5A shows a cross-sectional side view of a portion of an exemplary submount 505 including LED chips 515 on its surface 505a. The LED chips 515 are part of an array 510 that is not shown in its entirety in this figure. The array 510 of LED chips 515 may include a single overlying lens, as shown in FIG. 4A, or a plurality of lenses, as shown in FIG. 10 and as discussed further below. The description that follows applies to both of these embodiments.

As shown in FIG. 5A, a plurality of the LED chips 515 in the array 510 may be mounted at a non-zero mounting angle γ with respect to the surface 505a of the submount 505, thereby exhibiting a tilt τ with respect to the centerline of the respective lens base. (The tilt and mounting angle are related as follows: τ=90°−γ, where γ is greater than 0° and thus τ is less than 90°.) It is assumed that the surface 505a is substantially planar, with the exception of any recessed or protruding features that may be formed on the surface 505a to mount the LED chips 515 at the desired mounting angle γ.

All or a portion of the LED chips in the array may exhibit the tilt τ with respect to the centerline. For example, from about 25% to about 75% of the LED chips in the array may be mounted at a non-zero mounting angle γ with respect to the surface, thereby including the tilt τ. The amount of the non-zero mounting angle γ may lie between about 5° and 35°, or between about 18° and 22°. Accordingly, the tilt τ may lie between about 55° and about 85°, or between about 68° and about 72°.

As indicated in FIG. 5A, the amount of the tilt τ may be the same for each LED chip 515, or, as shown schematically in FIG. 5B, the amount may be different for one or more of the LED chips 515 in the array 510. For example, a first portion of the LED chips 515 may exhibit a first tilt $\tau_1$ and a second portion of the LED chips 515 may exhibit a second tilt $\tau_2$, where the two different tilts $\tau_1$ and $\tau_2$ correspond to two different mounting angles $\gamma_1$ and $\gamma_2$, respectively, on the surface 505a of the submount 505. For any given array, there may be as many as n different tilts $\tau_1, \tau_2, \ldots \tau_n$ and n different corresponding mounting angles $\gamma_1, \gamma_2 \ldots \gamma_n$, where n is less than or equal to the number of LED chips in the array. It is also possible that none of the LED chips in the array includes a tilt $\tau$; instead, displacements of the LED chips in the plane of the substrate may be relied upon to influence the emission profile.

Figure 6:
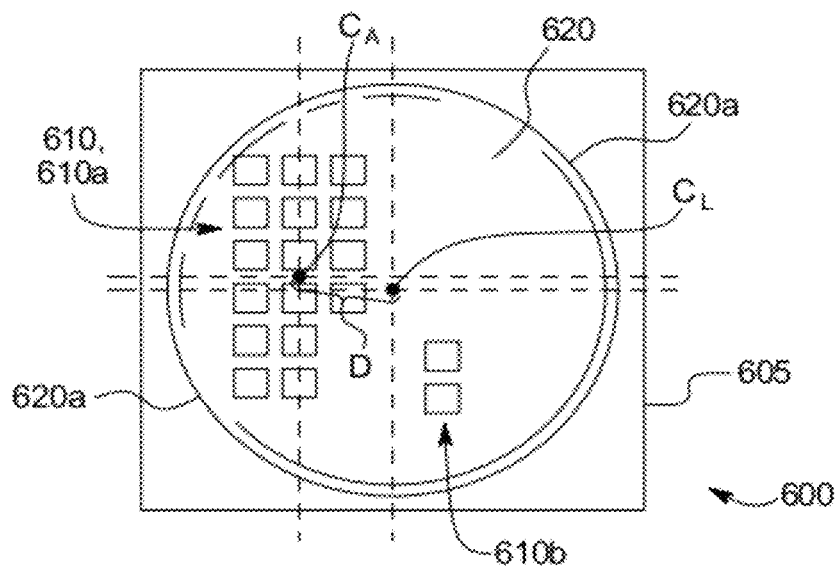
FIG. 6 is a top view of an exemplary LED component including an LED array having a subsection displaced to a different region of the substrate.

In another example of a possible displacement strategy, one or more of the LED chips in a given array may be displaced from the array to another location on the substrate. Referring to FIG. 6, the original array 610 may include a primary subsection 610a and a secondary subsection 610b, and the secondary subsection 610b of the array 610 may be displaced to another location on the submount 605. Such arrangements may have one or more effects on the emission profile of the LED component; for example, the peak emission of the LED array may be shifted and/or the intensity distribution of the LED array may be broadened compared to the original array. It may also be possible to obtain a multi-lobed emission profile. Referring again to FIG. 6, the original array 610 from which the subsection 610b is removed has a center $C_A$ that is offset with respect to the center $C_L$ of the lens base 620a of the overlying lens 620. It is also possible for the original array to be centered with respect to the lens base.

Figure 7:
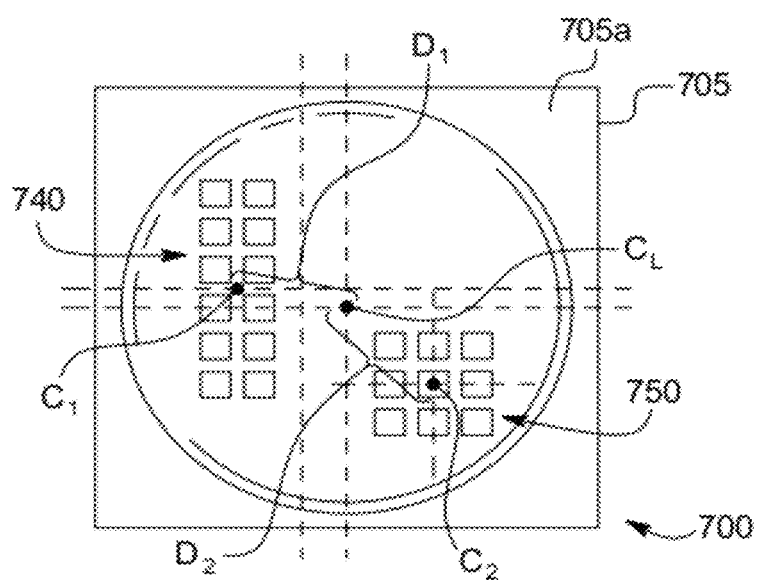
FIG. 7 is a top view of an exemplary LED component including two LED arrays, each array having a center displaced with respect to the center $C_L$ of the lens base.

In another example, the emission profile of the LED component may be modified by including more than one array of LED chips on the submount (in different locations), where each array has a center that is offset with respect to the center of the lens base. FIG. 7 shows, for example, disposed on the surface 705a of a monolithic substrate 705, a 6×2 array 740 of LED chips 715 having a center $C_1$ and a 3×3 array 750 of LED chips 715 having a center $C_2$, where both the center $C_1$ and the center $C_2$ include an offset $D_1, D_2$, respectively, from the center $C_L$ of the lens base 720a. In this example, the offsets $D_1, D_2$ differ in both magnitude and direction. Alternatively, the offsets may differ in magnitude but not in direction, or they may differ in direction but not in magnitude.

The LED chips in the array may exhibit a combination of the tilts and displacements described above. For example, one or more of the LED chips shown in any of FIGS. 4A, 4B, 6 and 7 may include a tilt $\tau$, where the tilt $\tau$ is as described above. It is also possible for all of the LED chips shown in any of these figures to include the tilt $\tau$ as described above. Similarly, the portions of the LED arrays 510 shown in FIGS. 5A and 5B, where the LED chips include a tilt $\tau$, may further include displacements in the plane of the submount that are not apparent in FIGS. 5A and 5B.

As mentioned above, the LED component may include a plurality of optical lenses where each of the lenses overlies one or more of the LED chips in the array. There may be a total of n lenses, where n is equal to the number of LED chips in the array. Alternatively, and as discussed further below, the number of lenses n may be less than the number of LED chips in the array.

Figure 8A:
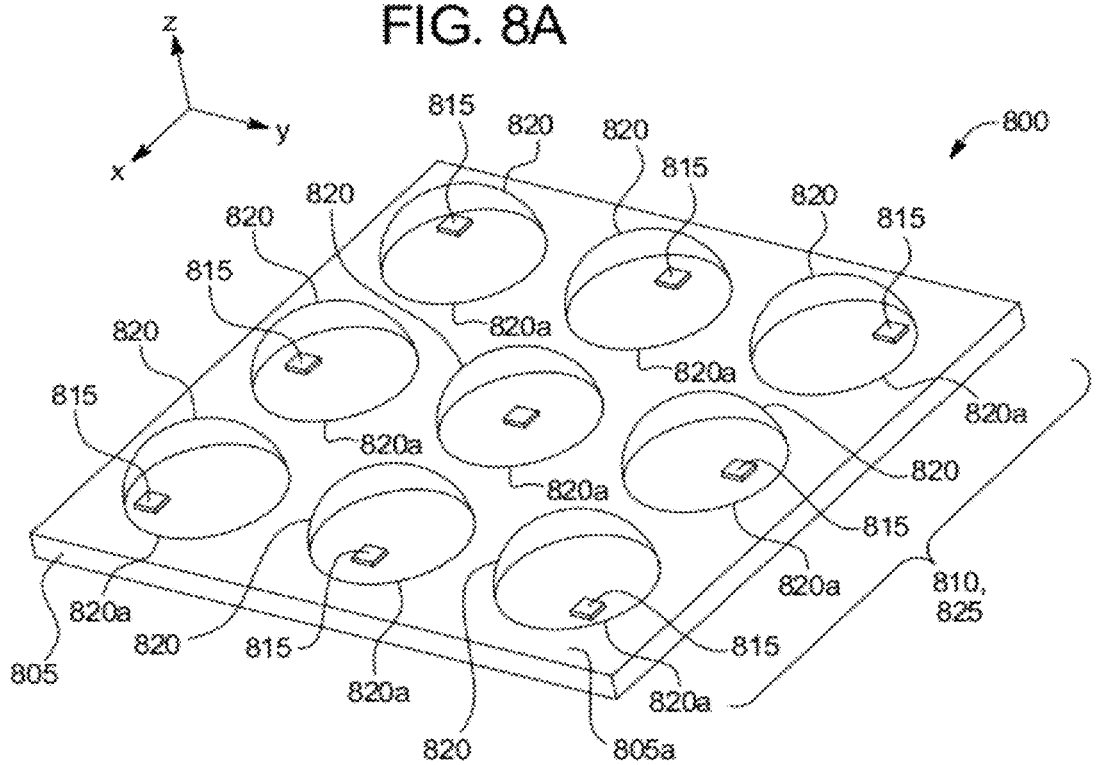
FIG. 8A is a perspective view of an exemplary LED component including an array of LED chips on a monolithic substrate where each LED chip includes an overlying lens.
Figure 8B:
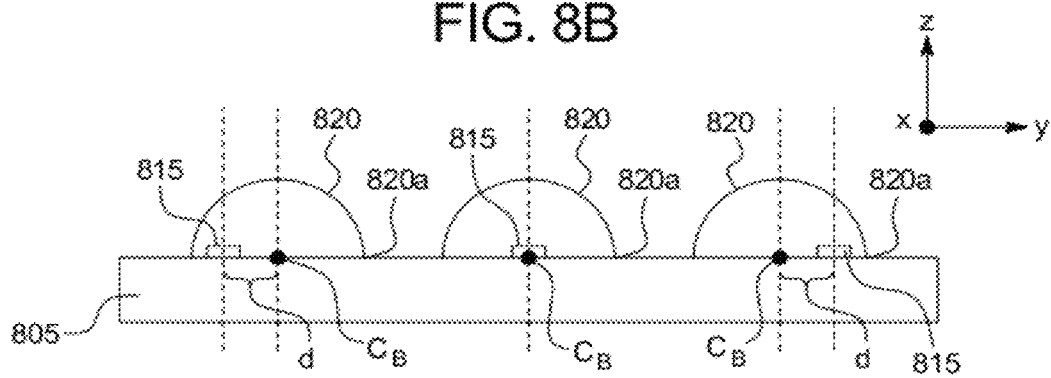
FIG. 8B is a cross-sectional view of the LED component of FIG. 8A.
Figure 16:
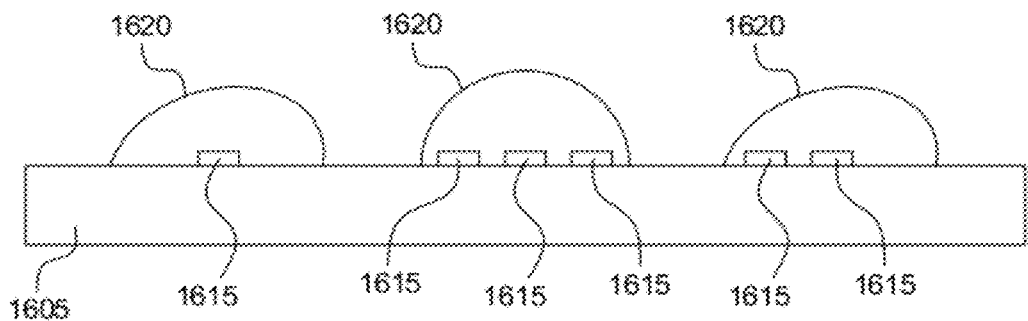
FIG. 16 a cross-sectional view of a portion of an LED component including an array of optical lenses where each lens overlies one or more LED chips, and further where some of the lenses have an asymmetric shape.

Referring to FIG. 8A, an array 825 of lenses 820 may be defined on the surface 805a of the monolithic submount 805, where each lens 820 has a lens base 820a and overlies, in this embodiment, a single LED chip 815. The array 825 of lenses 820 has a center $C_{LA}$, and each lens base 820a has a center $C_B$. In this example, the array 825 is a 3×3 array, but other array sizes are possible, as discussed further below. FIG. 8A shows lenses 820 that are hemispherical in shape; however, one or more of the lenses in the array may have another symmetric or asymmetric shape, as shown in FIG. 16, which is a side view of a submount 1605 supporting three lenses 1620 that each overlie one or more LED chips 1615.

In a traditional configuration, the LED chip 815 underlying each lens 820 is centered with respect to the respective lens base 820a. In order to provide a desired emission profile from the LED component 800, however, one or more of the LED chips 815 underlying one or more of the lenses 820 may include an offset d from the center $C_B$ of the respective lens base 820. The offset or displacement d is measured from the center of the LED chip 815 and may be in the ±x-direction, the ±y-direction, or in a direction lying between the ±x-direction and the ±y-direction. The amount of the displacement d may depend on the size of the lens 820 and the LED chip 815, but typically lies between about 0.1 mm and 1.2 mm. As a consequence of the displacement d, the peak emission of the LED chip 815 may be shifted from the perpendicular centerline of the respective lens base 820a. The overall effect of the displacement d of one or more of the LED chips 815, as shown for example in FIG. 8C, on the intensity profile of the LED component 800 may be a shifting and/or broadening of the emission profile. This is further discussed in Example 1.

Figure 8C:
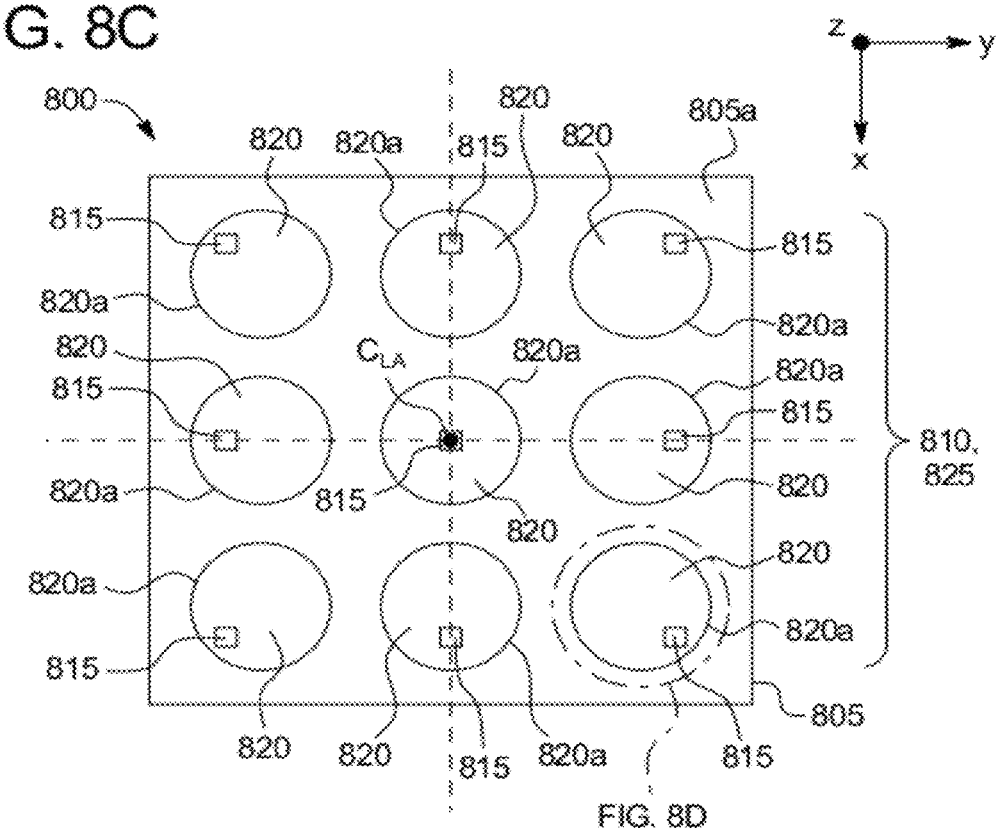
FIG. 8C is a top view of the LED component of FIG. 8A.
Figure 8D:
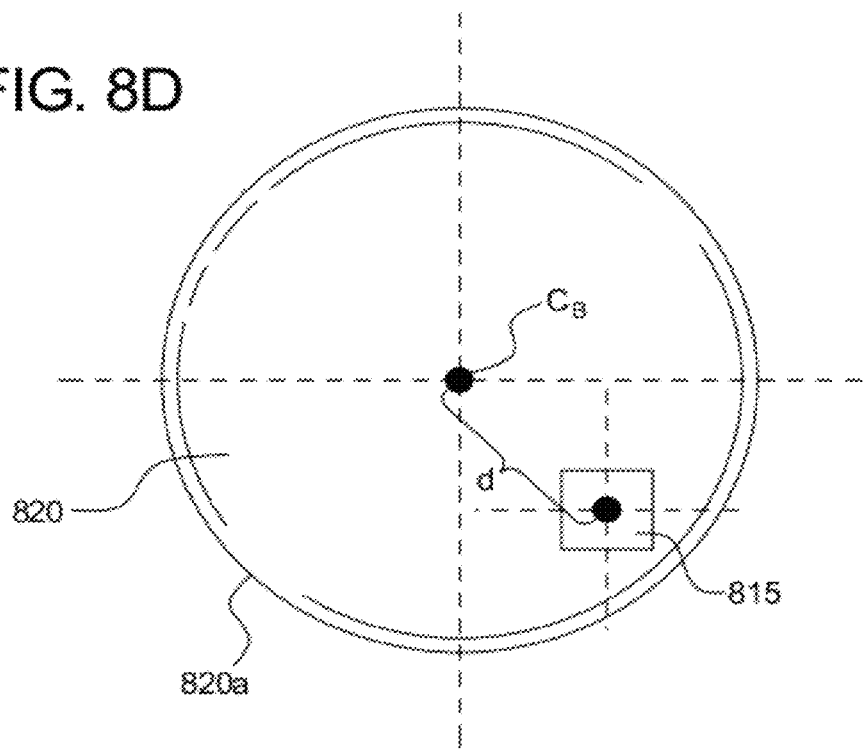
FIG. 8D is a close-up view of a portion of FIG. 8C showing the offset d between the center of the LED chip and the center $C_B$ of the lens base.

Referring to FIG. 8C, the array 825 of lenses 820 may thus include a first portion of LED chips 815, each having an offset d from the center of the respective lens base 820a, and a second portion of LED chips 815, each of which is centered with respect to the respective lens base 820a. In this example, the second portion includes only one LED chip 815; the LED chip 815 disposed in the center of the array 810 of LED chips 815 does not include an offset. In an alternative embodiment, all of the LED chips 815 in the array 810 may include an offset d from the center $C_B$ of the respective lens base 820a. The offset d for each LED chip may be the same, or different LED chips 815 may have offsets d that differ in magnitude and/or direction, as indicated schematically in FIGS. 8A-8D. Due to the displacements d of individual LED chips, the center $C_A$ of the array of LED chips may be displaced from the center $C_{LA}$ of the array of lenses.

Figure 9:
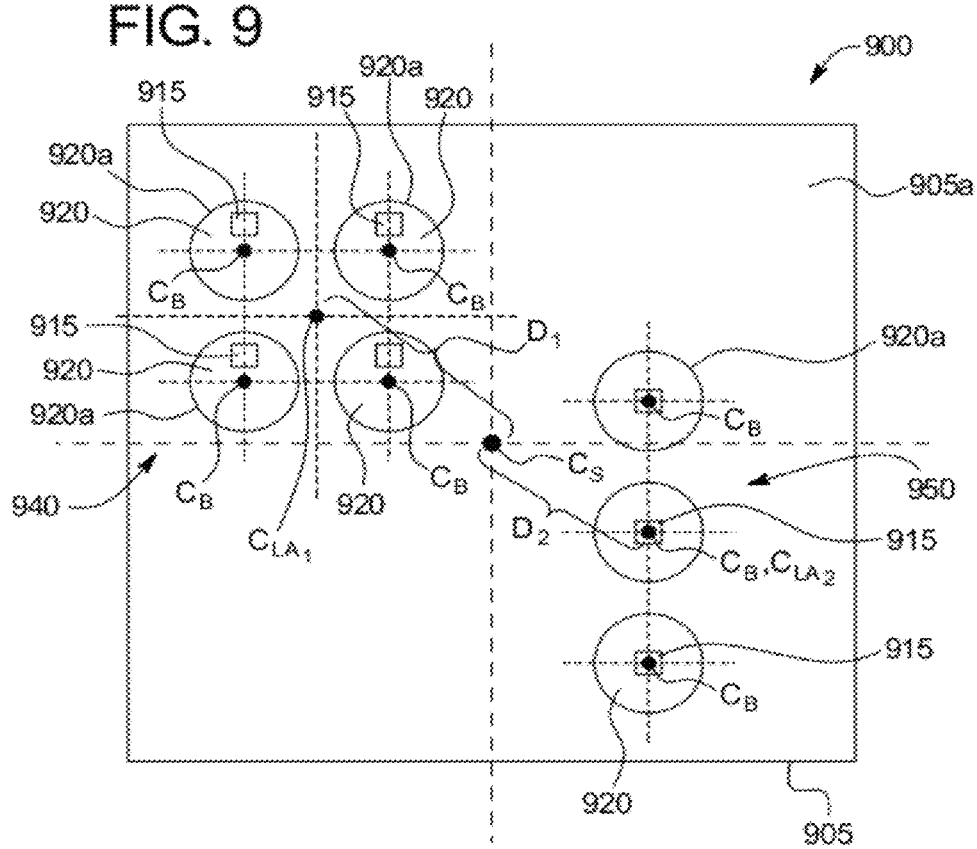
FIG. 9 is a top view of an exemplary LED component including two arrays of lenses having centers $C_{LA1}$, $C_{LA2}$ that are offset with respect to the center $C_S$ of the submount, where each lens overlies an LED chip that may be centered or offset with respect to the center $C_B$ of the respective lens base.

It is also contemplated that one or more of the lenses and the underlying LED chip(s) may be displaced from the original array of lenses, as described above and shown schematically in FIG. 6 for the single lens embodiment. The LED chip underlying each lens may remain centered with respect to the lens base or may include an offset with respect to the lens base, as discussed above. Furthermore, there may be more than one array of lenses overlying LED chips on the submount, where each array has a center that is displaced from the center of the submount. An exemplary LED component 900 including two arrays 940, 950 of lenses 920 overlying LED chips 915 is shown in FIG. 9; as can be seen, the center $C_{LA1}, C_{LA2}$ of each array 940, 950 includes an offset $D_1, D_2$ from the center $C_S$ of the surface 905a of the submount 905, and the offsets $D_1, D_2$ differ in both magnitude and direction. Alternatively, the offsets may differ in magnitude but not in direction, or they may differ in direction but not in magnitude. The LED chip 915 underlying each lens 920 may remain centered with respect to the lens base 920a, as is the case with the 3×1 array 950 shown in FIG. 9, or may include an offset d with respect to the center $C_B$ of the lens base, as is the case with the 2×2 array 940 shown in FIG. 9.

FIG. 10 shows a cross-sectional side view of a portion of an exemplary submount 1005 including LED chips 1015 on its surface 1005a. Each LED chip 1015 includes an overlying lens 1020. The lenses 1020 are part of an array 1025 of lenses 1020 that is not shown in its entirety in this figure. At least one of the LED chips 1015 is mounted at a non-zero mounting angle γ with respect to the surface 1005a of the submount 1005, thereby exhibiting a tilt τ with respect to the centerline of the lens base 1020a of the overlying lens 1020. FIG. 10 shows two LED chips 1015 that include the tilt τ, and one that does not. It is assumed that the surface 1005a is substantially planar, with the exception of any recessed or protruding features that may be formed on the surface 1005a to mount the LED chips 1015 at the desired mounting angle γ.

In general, as in the single lens embodiment, all or a portion of the LED chips in the array may exhibit the tilt τ with respect to the centerline of the lens base. For example, from about 25% to about 75% of the LED chips in the array may be mounted at a non-zero mounting angle γ with respect to the surface, thereby including the tilt τ. The amount of the non-zero mounting angle γ may lie between about 5° and 35°, or between about 18° and 22°. Accordingly, the tilt τ may lie between about 55° and about 85°, or between about 68° and about 72°.

As discussed above, the amount of the tilt τ may be the same for each LED chip, or the amount may be different for one or more of the LED chips in the array. For example, a first portion of the LED chips may exhibit a first tilt $\tau_1$ and a second portion of the LED chips may exhibit a second tilt $\tau_2$, where the two different tilts $\tau_1$ and $\tau_2$ correspond to two different mounting angles $\gamma_1$ and $\gamma_2$, respectively, on the surface of the submount. For any given array, there may be as many as n different tilts $\tau_1, \tau_2, \ldots \tau_n$ and n different corresponding mounting angles $\gamma_1, \gamma_2 \ldots \gamma_n$, where n is less than or equal to the number of LED chips in the array.

Furthermore, the LED chips in the multiple lens array may exhibit a combination of the tilts and displacements described above. For example, in FIG. 10 the outermost LED chips 1015 include the tilt τ and the innermost LED chip 1015 includes a displacement d with respect to the center $C_B$ of the lens base 1020a. Any or all of the LED chips shown in FIGS. 8A-8D and FIG. 9 may be mounted at an angle γ with respect to the surface of the submount, so as to exhibit a tilt τ as described above. Similarly, the portion of the multiple lens array 1025 shown in FIG. 10, where two of the LED chips 1015 include a tilt τ, may further include displacements in the plane of the submount that are not apparent in FIG. 10.

Figure 15A:
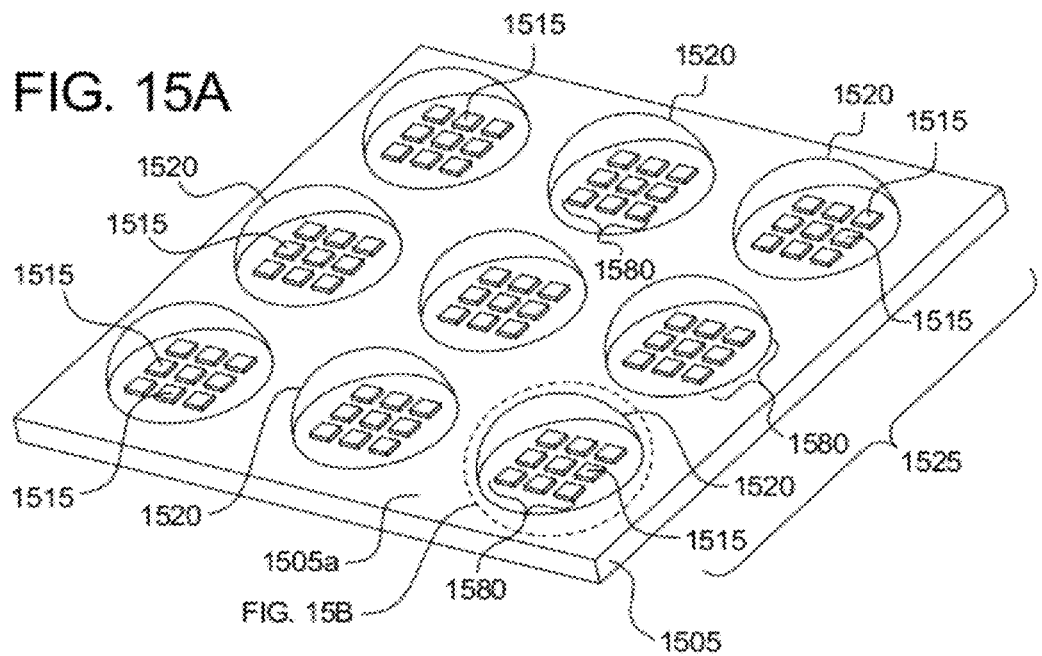
FIG. 15A is a perspective view of an exemplary LED component including an array of LED chips and an array of optical lenses on a monolithic substrate, where the number of LED chips exceeds the number of lenses and where each of the lenses overlies a plurality of LED chips.
Figure 15B:
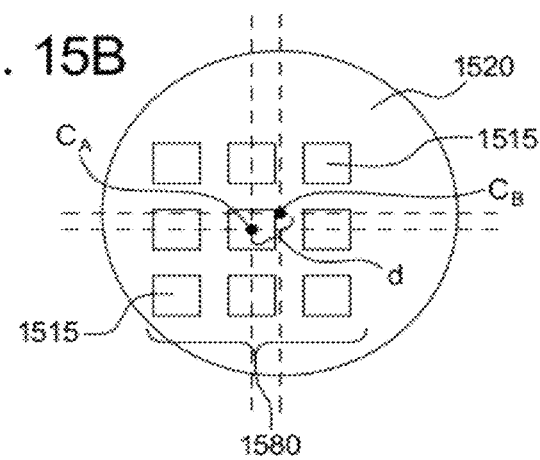
FIG. 15B is a close-up view of a portion of FIG. 15A showing the offset d between the center $C_A$ of the plurality LED chips and the center $C_B$ of the lens base.

In addition, in an implementation in which the number of lenses 1520 in the array 1525 is less than the number of LED chips 1515, at least one of the lenses 1520 in the multiple lens array 1525 may overlie a plurality 1580 of LED chips 1515, as shown for example in FIG. 15A. The plurality of LED chips 1515 may constitute a subarray of LED chips 1515 that may be ordered or disordered. Similar to the preceding embodiments, a center $C_A$ of the plurality 1580 of LED chips 1515 may be displaced from a center $C_B$ of the respective lens base by a displacement amount d, as shown in FIG. 15B. It is also contemplated that at least one of the LED chips 1515 in the plurality 1580 may be mounted at a non-zero angle γ with respect to the surface 1505a of the substrate 1505, thereby comprising a tilt τ with respect to the perpendicular centerline of the respective lens base 1520a. In general, the LED chips 1515 in the plurality 1580 may exhibit a combination of the tilts and displacements described above. Also, at least one of the optical lenses that overlies the plurality of LED chips may have an asymmetric shape.

It is also possible, in the case of a multiple lens array, that at least one of the LED chips in the array may not underlie a lens. This may be the case when the number of lenses is less than the number of LED chips.

The arrays and subarrays of LED chips described herein may include any number of LED chips in order to provide the desired light output from the LED component. For example, the array may include at least two LED chips, at least four LED chips, at least eight LED chips, at least 12 LED chips, or at least 20 LED chips. Much larger arrays are also possible. For example, the LED component may have an array of at least about 50, or at least about 100, LED chips arranged on its surface. The arrays may be symmetric or asymmetric. Exemplary LED chip arrays on monolithic substrates (chip on board (CoB) structures) are described in, for example, U.S. Pat. No. 7,821,023 to Yuan et al., issued on Oct. 26, 2010, and U.S. Patent Application Publication No. 2009/0108281 to Keller et al., published on Apr. 30, 2009, which are hereby incorporated by reference in their entirety.

Fabrication of conventional LEDs is generally known, and is only briefly described here. LEDs can be fabricated using known processes, with a suitable process being metal organic chemical vapor deposition (MOCVD). The layers of the LEDs generally comprise an active layer/region sandwiched between first and second oppositely doped epitaxial layers all of which are formed successively on a growth substrate. LEDs can be formed on a wafer and then singulated for mounting in a package. It is understood that the growth substrate can remain as part of the final singulated LED or the growth substrate can be fully or partially removed.

Additional layers and elements may also be included in the LEDs, including but not limited to buffer, nucleation, contact and current spreading layers, as well as light extraction layers and elements. The active region can comprise single quantum well (SQW), multiple quantum well (MQW), double heterostructure or superlattice structures. The active region and doped layers may be fabricated from different material systems, with preferred material systems being Group-III nitride based material systems. Group-III nitrides refer to those semiconductor compounds formed between nitrogen and the elements in the Group III of the periodic table, usually aluminum (Al), gallium (Ga), and indium (In). The term also refers to ternary and quaternary compounds such as aluminum gallium nitride (AlGaN) and aluminum indium gallium nitride (AlInGaN). In a preferred embodiment, the doped layers are gallium nitride (GaN) and the active region is InGaN. In alternative embodiments the doped layers may be AlGaN, aluminum gallium arsenide (AlGaAs) or aluminum gallium indium arsenide phosphide (AlGaInAsP).

The growth substrate can be made of many materials such as sapphire, silicon carbide, aluminum nitride (AlN), gallium nitride (GaN), with a suitable substrate being a 4H polytype of silicon carbide, although other silicon carbide polytypes can also be used including 3C, 6H and 15R polytypes. Silicon carbide has certain advantages, such as a closer crystal lattice match to Group III nitrides than sapphire and results in Group III nitride films of higher quality. Silicon carbide also has a very high thermal conductivity so that the total output power of Group-III nitride devices on silicon carbide is not limited by the thermal dissipation of the substrate (as may be the case with some devices formed on sapphire). SiC substrates are available from Cree Research, Inc., of Durham, N.C. and methods for producing them are set forth in the scientific literature as well as in U.S. Pat. No. Re. 34,861; U.S. Pat. Nos. 4,946,547; and 5,200,022.

LEDs can also comprise a conductive current spreading structure and wire bond pads on the top surface, both of which are made of a conductive material that can be deposited using known methods. Some materials that can be used for these elements include Au, Cu, Ni, In, Al, Ag or combinations thereof as well as conducting oxides and transparent conducting oxides. The current spreading structure can comprise conductive fingers arranged in a grid on the LEDs with the fingers spaced to enhance current spreading from the pads into the top surface of the LEDs. In operation, an electrical signal is applied to the pads through a wire bond, and the electrical signal spreads through the fingers of the current spreading structure and the top surface into the LEDs. Current spreading structures are often used in LEDs where the top surface is p-type, but can also be used for n-type materials.

Some or all of the LEDs described herein can be coated with one or more phosphors with the phosphors absorbing at least some of the LED light and emitting a different wavelength of light such that the LED emits a combination of light from the LED and the phosphor. In one embodiment according to the present invention the white emitting LEDs have an LED that emits light in the blue wavelength spectrum and the phosphor absorbs some of the blue light and re-emits yellow. The LEDs emit a white light combination of blue and yellow light. In other embodiments, the LED chips emit a non-white light combination of blue and yellow light as described in U.S. Pat. No. 7,213,940. In some embodiments the phosphor comprises commercially available YAG:Ce, although a full range of broad yellow spectral emission is possible using conversion particles made of phosphors based on the $(Gd,Y)_3(Al, Ga)_5O_{12}$:Ce system, such as the $Y_3Al_5O_{12}$:Ce (YAG). Other yellow phosphors that can be used for white emitting LED chips include: $Tb_{3-x}RE_xO_{12}$:Ce(TAG); RE=Y, Gd, La, Lu; or $Sr_{2-x-y}Ba_xCa_ySiO_4$:Eu.

LEDs that emit red light can comprise LED structures and materials that permit emission of red light directly from the active region. Alternatively, the red emitting LEDs can comprise LEDs covered by a phosphor that absorbs the LED light and emits a red light. Some phosphors appropriate for these structures may include: $Lu_2O_3$:Eu$^{3+}$; $(Sr_{2-x}La_x)$ $(Ce_{1-x}Eu_x)$ $O_4$; $Sr_{2-x}Eu_xCeO_4$; $SrTiO_3$:Pr$^{3+}$, Ga$^{3+}$; $CaAlSiN_3$:Eu$^{2+}$; and $Sr_2Si_5N_8$:Eu$^{2+}$.

LEDs may be coated with a phosphor using many different methods, with one suitable method being described U.S. patent application Ser. No. 11/656,759 (U.S. Patent Application Publication 2008/0173884) and Ser. No. 11/899,790 (U.S. Patent Application Publication 2008/0179611), both entitled "Wafer Level Phosphor Coating Method and Devices Fabricated Utilizing Method," and both of which are incorporated herein by reference. Alternatively, the LEDs can be coated using other methods, such as electrophoretic deposition (EPD), with a suitable EPD method described in U.S. patent application Ser. No. 11/473,089 (U.S. Patent Application Publication 2007/0158668) entitled "Close Loop Electrophoretic Deposition of Semiconductor Devices," which is also incorporated herein by reference. It is understood that LED components according to the present disclosure can also have multiple LEDs of different colors, one or more of which may be white emitting.

The submounts may be formed of many different materials with a preferred material being an electrically insulating material, such as a dielectric element, with the submount being between the LED array and the component backside. The submount may include a ceramic such as alumina, aluminum nitride, silicon carbide, or a polymeric material such as polymide and polyester, etc. In one embodiment, the dielectric material has a high thermal conductivity such as with aluminum nitride and silicon carbide. In other embodiments, the submounts can include highly reflective material, such as reflective ceramic or metal layers like silver, to enhance light extraction from the component. In other embodiments the submount can comprise a printed circuit board (PCB), alumina, sapphire or silicon or any other suitable material, such as T-Clad thermal clad insulated substrate material, available from The Bergquist Company of Chanhassen, Minn. For PCB embodiments, different PCB types can be used, such as standard FR-4 PCB, metal core PCB, or any other type of printed circuit board.

Figure 11:
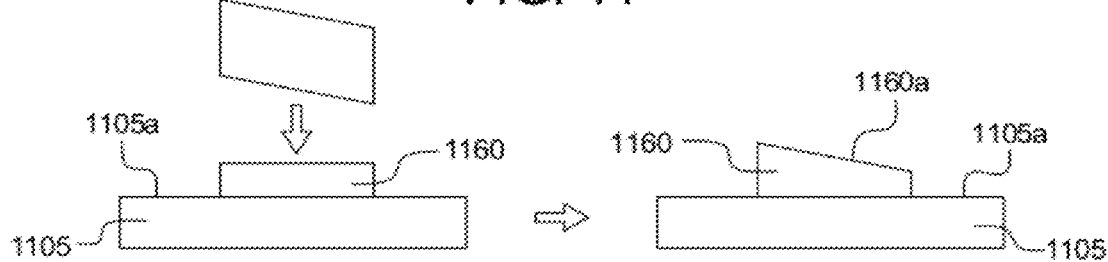
FIG. 11 is a schematic showing a stamping process that may be employed to fabricate an angled landing pad for mounting an LED chip at an angle γ to the surface of the submount.

The submount may be modified to include one or more protruding or recessed regions that allow for a nonzero mounting angle γ of one or more of the LED chips. For example, material may be added to a substantially planar submount to create the desired surface profile for the LED component. Referring to FIG. 11, a thick chip landing pad 1160 may be deposited on the surface 1105a of the submount 1105, and the landing pad 1160 may be stamped or otherwise deformed to create an angled landing pad surface 1160a that allows an LED chip to be mounted at the desired mounting angle γ on the submount 1105.

Figure 12A:
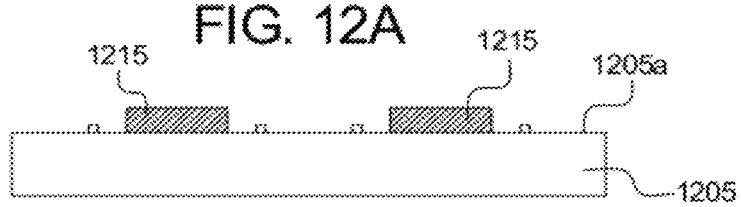
FIGS. 12A-12C are schematics showing how a stamping process may be applied directly to a submount to create angled protrusions and depressions in the frontside and backside surfaces of the submount.
Figure 12B:

In another approach, stamping may be applied directly to a submount to create a desired surface profile. For example, one or more recessed features may be stamped into the backside of a substrate in order to create a desired profile of protruding feature(s) on the frontside of the substrate. FIG. 12A shows a cross-sectional schematic of an exemplary monolithic substrate 1205 including two LED chips 1215 disposed on the surface 1205a. Prior to stamping, the LED chips 1215 are mounted flat on the surface and do not include a mounting angle γ. FIG. 12B shows the creation of two protrusions 1270 underlying the two LED chips 1215 in the frontside 1205a of the substrate 1205 by stamping local regions of the backside 1205b of the substrate 1205. After stamping, the protruding regions 1270 extend from the front surface 1205a of the substrate 1205 at the desired mounting angle γ. LED chips 1215 positioned on the protruding regions 1270 thus have a predetermined tilt τ with respect to the centerline of the submount 1205. The LED chips 1215 may be placed on the substrate 1205 and connected electrically either before or after the protruding regions 1270 are created. Also, individual lenses overlying each LED chip 1215, or a single larger lens overlying all of the LED chips 1215 on the substrate 1205, may be molded onto the submount 1005 after forming the one or more protruding regions 1270.

Figure 12C:
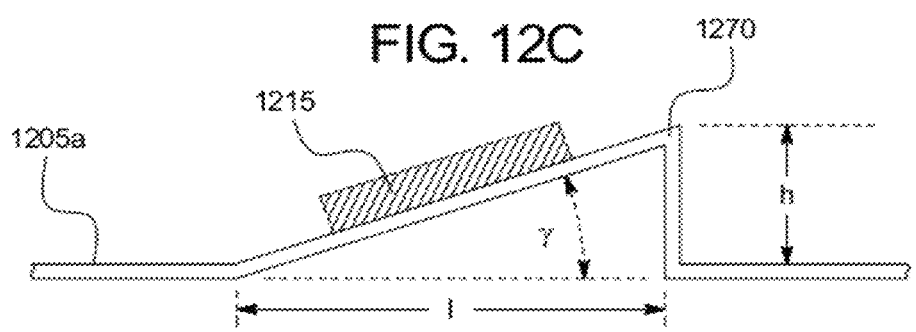

The specific geometry of the mounting region depends on the desired tilt for the LED chip as well as the size of the chip. Referring to FIG. 12C, the exemplary LED chip 1215 shown is mounted on a mounting region 1270 of 2 mm in length/at a mounting angle γ of 12°, and thus the mounting region protrudes from the surface 1205a a distance (or height) h=2 mm·tan(12°)=0.425 mm. Generally speaking, the length/of the mounting region may range from about 1.0 mm to about 6.0 mm, and the height h of the mounting region may lie between about 0.2 mm and about 2.2 mm. The width w of the mounting region may be between about 1.0 mm and about 6.0 mm, typically. The mounting angle γ, as described above, typically ranges from about 5 degrees to about 35 degrees.

Different shifts or tilts in the peak emission of the LED component may be desired depending on the size and intended use of the display. An appropriate range for the shift in the peak emission may be between about 5 degrees and about 30 degrees for many possible applications, and the shift may also lie between about 10 degrees and about 20 degrees. Alternatively, other ranges of shift angles can be used.

Example 1

The change in the intensity distribution that results from purposely moving LED chips off-center with respect to an overlying lens is explored in this example. FIG. 13A is a photograph of an exemplary LED component including 12 LED chips, each with its own hemispherical lens. Three cases are examined: LED chip 1315 at lens 1320 optical center (center of lens base 1320*a*) (FIG. 13C); LED chip 1315 offset radially inward (FIG. 13D); and LED chip 1315 offset radially outward (FIG. 13E). The chip 1315 physical offset is ~220-230 micrometers in a 3.0 mm diameter lens 1320.

The chart in FIG. 13B shows that the amount of light as a function of angle from the perpendicular is different for offset chip placement vs. an on-axis placement case. In particular, offsetting the LED chip 1315 as described with respect to the overlying lens 1320 leads to a broadening of the intensity beam profile. For this example, the difference in light output varies by angle and is maximum in the 30-60 degree range at ~6-8%.

Example 2

Figure 14A:
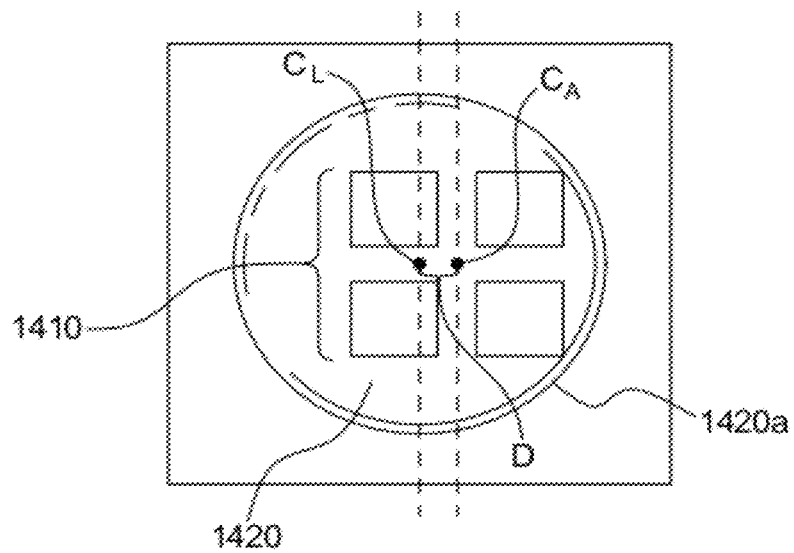
FIG. 14A is a top view of an exemplary LED component including a 2×2 array of LED chips.

In this example, the center $C_A$ of a (2×2) chip array 1410 is offset as a unit with respect to the center $C_L$ of a single overlying lens 1420. The geometry of the array 1410 is shown in FIG. 14A. The offset D between the center $C_A$ of the LED chip array 1410 and the center $C_L$ of the lens 1420 (lens base 1420*a*) is varied and the resulting flux profile is obtained (FIG. 14B).

Figure 14B:
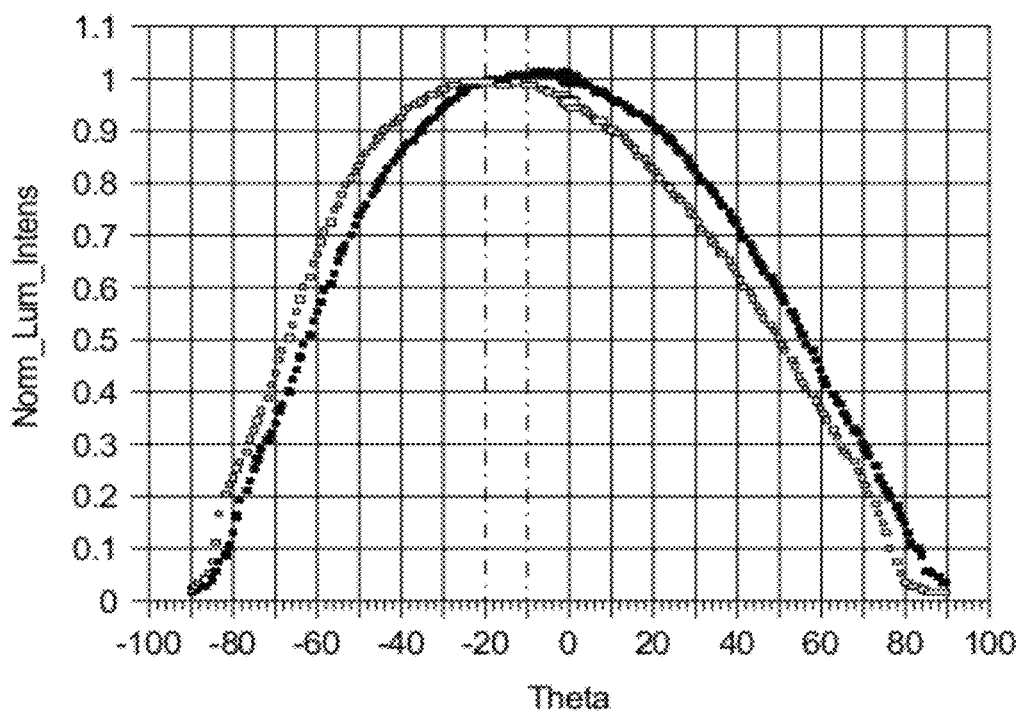
FIG. 14B is a chart showing the shift in the intensity profile that occurs depending on the amount of displacement between the center of the LED chip array of FIG. 14A and the center of the lens base.

Referring to the data shown in FIG. 14B, a 0.3 mm offset between the center $C_A$ of the LED chip array 1410 and the center $C_L$ of the lens 1420 yields approximately a 10 degree shift in the position of the emission peak. A 0.6 mm offset between the center of the LED chip array and the center of the lens yields approximately a 20 degree shift in emission peak position.

In summary, the peak emission characteristics of the LED components described in the present patent document may be shifted away from the perpendicular centerline and in some cases otherwise modified for applications where a shifted, nonuniform, broadened, and/or multi-lobed intensity profile may be advantageous. For example, the LED components described herein may be beneficial for displays that are mounted above eye level of the likely viewer. The technology may permit an LED display to be mounted flat in an elevated location, such as a stadium, eliminating the cost and complications for mounting the display at an angle while still allowing for more LED light to be directed along the viewer's line of sight. The technology may also have benefits for other display applications, including street lights, automotive lights, and architectural lighting.

Although the present invention has been described in considerable detail with reference to certain embodiments thereof, other embodiments are possible without departing from the present invention. The spirit and scope of the appended claims should not be limited, therefore, to the description of the preferred embodiments contained herein. All embodiments that come within the meaning of the claims, either literally or by equivalence, are intended to be embraced therein. Furthermore, the advantages described above are not necessarily the only advantages of the invention, and it is not necessarily expected that all of the described advantages will be achieved with every embodiment of the invention.

The invention claimed is:

1. A light emitting diode (LED) component comprising:
   a monolithic substrate;
   an array of LED chips disposed on a surface of the substrate; and
   an optical lens overlying the LED chips and having a lens base attached to the substrate,
   wherein the LED chips are positioned to provide a peak emission shifted from a perpendicular centerline of the lens base, at least one of the LED chips being mounted at a non-zero angle γ with respect to the surface of the substrate, the LED chip thereby comprising a tilt τ with respect to the perpendicular centerline.

2. The LED component of claim 1 wherein a center $C_A$ of the array is displaced from a center $C_L$ of the lens base by a displacement amount D.

3. The LED component of claim 2 wherein the displacement amount D lies between about 0.1 mm and 6.0 mm.

4. The LED component of claim 2 wherein a center $C_A$ of the array is displaced from a center $C_S$ of the surface of the substrate.

5. The LED component of claim 2 wherein a center $C_L$ of the lens base is displaced from a center $C_S$ of the surface of the substrate.

6. The LED component of claim 2 further comprising at least one additional array of LED chips disposed on the surface of the substrate, the additional array having a center $C_x$ displaced from the center $C_L$ of the lens base.

7. The LED component of claim 2 wherein the array of LED chips comprises a primary subsection and at least one additional subsection, the additional subsection being displaced from the primary subsection on the surface of the substrate,
   wherein the center $C_A$ of the array is defined with respect to the primary subsection and the at least one additional subsection being positioned together.

8. The LED component of claim 1 wherein an amount of the non-zero angle γ lies between about 5° and about 35°, and an amount of the tilt t lies between about 55° and 85°.

9. The LED component of claim 1 wherein a plurality of the LED chips comprise the tilt τ.

10. The LED component of claim 9, wherein the plurality includes from about 25% to about 75% of the LED chips in the array.

11. The LED component of claim 9 wherein an amount of the tilt τ is the same for each of the LED chips comprising the tilt τ.

12. The LED component of claim 9 wherein an amount of the tilt is different for at least one of the LED chips comprising the tilt τ.

13. The LED component of claim 1 wherein the optical lens comprises an asymmetric shape.

14. The LED component of claim 1 wherein the peak emission comprises a shift from the perpendicular centerline of between about 5 degrees and about 30 degrees.

15. The LED component of claim 14 wherein the peak emission comprises a shift from the perpendicular centerline of between about 10 degrees and about 20 degrees.

16. A light emitting diode (LED) component comprising:
    a monolithic substrate; and
    an array of individually unpackaged LED chips disposed on a surface of the substrate,
    wherein at least one of the individually unpackaged LED chips is mounted at a non-zero angle γ with respect to the surface of the substrate, and
    wherein a center $C_A$ of the array is displaced from a center $C_S$ of the surface of the substrate by a displacement amount D.

17. The LED component of claim 16 wherein the array is a disordered array.

18. A light emitting diode (LED) component comprising:
    a monolithic substrate;
    a first array and a second array of LED chips disposed on a surface of the substrate; and
    an optical lens overlying the LED chips and having a lens base attached to the substrate, wherein the LED chips are positioned to provide a peak emission shifted from a perpendicular centerline of the lens base, wherein a center $C_A$ of the first array and a center $C_X$ of the second array are displaced from a center $C_L$ of the lens base.

19. A light emitting diode (LED) component comprising:

a monolithic substrate;

an array of LED chips disposed on a surface of the substrate; and an optical lens overlying the LED chips and having a lens base attached to the substrate, wherein the LED chips are positioned to provide a peak emission shifted from a perpendicular centerline of the lens base, wherein a center $C_A$ of the array is displaced from a center $C_L$ of the lens base and from a center $C_S$ of the surface of the substrate.

* * * * *